United States Patent
You et al.

(10) Patent No.: US 11,949,010 B2
(45) Date of Patent: Apr. 2, 2024

(54) METAL OXIDE SEMICONDUCTOR DEVICE AND METHOD FOR MANUFACTURING THE SAME

(71) Applicant: Silergy Semiconductor Technology (Hangzhou) LTD, Hangzhou (CN)

(72) Inventors: Budong You, Hangzhou (CN); Chunxin Xia, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 57 days.

(21) Appl. No.: 17/480,374

(22) Filed: Sep. 21, 2021

(65) Prior Publication Data
US 2022/0102550 A1   Mar. 31, 2022

(30) Foreign Application Priority Data
Sep. 29, 2020   (CN) .......................... 202011045949.5

(51) Int. Cl.
*H01L 29/78* (2006.01)
*H01L 29/06* (2006.01)
*H01L 29/08* (2006.01)
*H01L 29/66* (2006.01)

(52) U.S. Cl.
CPC ...... *H01L 29/7816* (2013.01); *H01L 29/0611* (2013.01); *H01L 29/0882* (2013.01); *H01L 29/66681* (2013.01)

(58) Field of Classification Search
CPC .............. H01L 29/7835; H01L 29/7816; H01L 29/66681; H01L 29/66659; H01L 29/0615; H01L 29/0611; H01L 29/0607; H01L 29/0603
See application file for complete search history.

(56) References Cited

U.S. PATENT DOCUMENTS

| | | | |
|---|---|---|---|
| 7,018,899 B2 | 3/2006 | Sung |
| 7,074,659 B2 | 7/2006 | Zuniga et al. |
| 7,230,302 B2 | 6/2007 | Lotfi et al. |
| 7,888,222 B2 | 2/2011 | You et al. |
| 7,981,739 B1 | 7/2011 | You et al. |
| 7,999,318 B2 | 8/2011 | Zuniga et al. |
| 8,063,444 B2 | 11/2011 | Chang |
| 8,119,507 B2 | 2/2012 | You |
| 8,173,510 B2 | 5/2012 | Denison et al. |
| 8,293,612 B2 | 10/2012 | Lee |
| 8,319,283 B2 | 11/2012 | Min et al. |
| 8,431,450 B1 | 4/2013 | Zuniga et al. |
| 8,455,340 B2 | 6/2013 | Zuniga et al. |
| 8,574,973 B1 | 11/2013 | You et al. |
| 8,581,344 B2 | 11/2013 | Liu |

(Continued)

*Primary Examiner* — Raj R Gupta

(57) ABSTRACT

A metal-oxide-semiconductor device can include: a base layer; a source region extending from an upper surface of the base layer to internal portion of the base layer and having a first doping type; a gate structure located on the upper surface of the base layer and at least exposing the source region, and a semiconductor layer located on the upper surface of the base layer and having the first doping type, where the semiconductor layer is used as a partial withstand voltage region of the device, and the source region is located at a first side of the gate structure, the semiconductor layer is located at a second side of the gate structure, and the first side and the second side of the gate structure are opposite to each other.

20 Claims, 2 Drawing Sheets

(56) References Cited

U.S. PATENT DOCUMENTS

| | | |
|---|---|---|
| 8,716,790 B2 | 5/2014 | Lotfi et al. |
| 8,716,795 B2 | 5/2014 | You |
| 8,912,600 B2 | 12/2014 | You |
| 2006/0202281 A1* | 9/2006 | Aisawa .................. H01L 24/05 |
| | | 257/E23.021 |
| 2010/0052052 A1 | 3/2010 | Lotfi et al. |
| 2013/0015523 A1* | 1/2013 | You .................... H01L 29/7835 |
| | | 438/286 |
| 2013/0020632 A1 | 1/2013 | Disney |
| 2013/0240989 A1* | 9/2013 | Glass .................. H01L 29/785 |
| | | 438/197 |
| 2014/0320174 A1 | 10/2014 | Lu et al. |
| 2015/0380398 A1 | 12/2015 | Mallikarjunaswamy |
| 2017/0263766 A1 | 9/2017 | Xia et al. |
| 2018/0190814 A1 | 7/2018 | Pendharkar et al. |
| 2019/0165167 A1 | 5/2019 | Lin et al. |
| 2019/0229212 A1* | 7/2019 | Wu .................... H01L 29/0882 |
| 2019/0267455 A1 | 8/2019 | Lin et al. |
| 2019/0371902 A1 | 12/2019 | Castro et al. |

* cited by examiner

METAL OXIDE SEMICONDUCTOR DEVICE AND METHOD FOR MANUFACTURING THE SAME

RELATED APPLICATIONS

This application claims the benefit of Chinese Patent Application No. 202011045949.5, filed on Sep. 29, 2020, which is incorporated herein by reference in its entirety.

FIELD OF THE INVENTION

The present invention generally relates to semiconductor technology, and more particularly to metal-oxide-semiconductor devices, and methods for manufacturing such devices.

BACKGROUND

The two mainstream power metal-oxide-semiconductor field-effect transistors (MOSFETs) are laterally-diffused MOS (LDMOS) devices and trench MOS devices. In high-voltage power integrated circuits, such as switching power supplies, high-voltage LDMOS devices are often used to meet the requirements of high-voltage and power control. However, in order to meet high withstand voltages, the length of the drift region of the LDMOS device may generally be relatively long, which can increase the on-resistance and the size of the device. The trench MOS device generally has a reduced device size, but has a more complicated manufacturing process that may not be compatible with a CMOS process.

DETAILED DESCRIPTION

Figure 1:
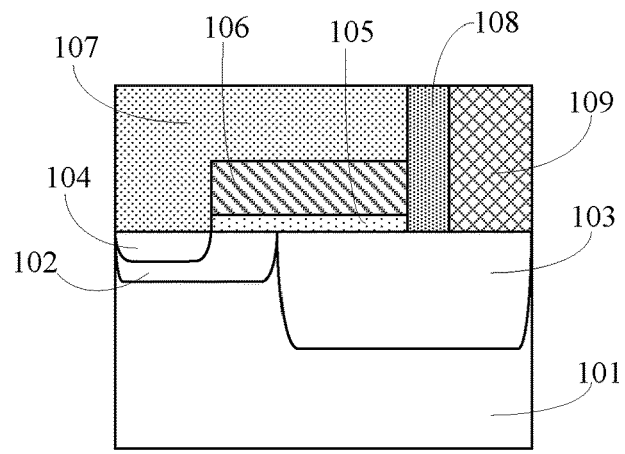
FIG. 1 is a cross-sectional view diagram of a first example metal-oxide-semiconductor device, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region. In contrast, when one layer is referred to as being "directly on" or "on and adjacent to" or "adjoin" another layer or region, there are not intervening layers or regions present. In the present application, when one region is referred to as being "directly in," that region can be directly in another region and adjoins the another region, but not in an implantation region of the another region. In the present application, the term "semiconductor structure" may generally be the semiconductor structure formed at each step of a method for manufacturing the semiconductor device, including all of the layers and regions having been formed.

Unless the context clearly indicates otherwise, each part of the semiconductor device can be made of material(s) well known to one skilled in the art. The semiconductor material can include, e.g., group III-V semiconductor(s), such as GaAs, InP, GaN, and SiC, and group IV semiconductor(s), such as Si, and Ge. A gate conductor may be made of any conductive material, such as metal, doped polysilicon, and/or a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, $Ni_3Si$, Pt, Ru, W, and their combinations. A gate dielectric may be made of $SiO_2$ or any material having dielectric constant larger than that of $SiO_2$. For example, the gate dielectric may be made of one selected from a group consisting of oxides, nitrides, oxynitrides, silicates, aluminates, and titanates. Moreover, the gate dielectric can be made of those developed in the future, besides the above known materials.

In particular embodiments, a metal-oxide-semiconductor device can include: a base layer; a source region extending from an upper surface of the base layer to internal portion of the base layer and having a first doping type; a gate structure located on the upper surface of the base layer and at least exposing the source region, and a semiconductor layer located on the upper surface of the base layer and having the first doping type, where the semiconductor layer is used as a partial withstand voltage region of the device, and the source region is located at a first side of the gate structure, the semiconductor layer is located at a second side of the gate structure, and the first side and the second side of the gate structure are opposite to each other. The device can also include a body region extending from the upper surface of the base layer to internal portion of the base layer and having a second doping type, where the source region is located in the body region, and a part of the body region is covered by the gate structure. The device can also include a region having the first doping type in the base layer, where the region at least simultaneously in contact with the upper surface of the base layer, the body region and the semiconductor layer.

Referring now to FIG. 1, shown is a cross-sectional view diagram of a first example metal-oxide-semiconductor device, in accordance with embodiments of the present invention. In this particular example, the metal-oxide-semiconductor device can include base layer 101, source region 104, a gate structure, and semiconductor layer 109. Source region 104 may extend from an upper surface of base layer 101 to internal portion of the base layer 101, and source region 104 can be a "first" doping type. The gate structure may be located on the upper surface of base layer 101, the gate structure can at least expose source region 104, and the gate structure can include gate oxide layer 105 and gate conductor 106. Semiconductor layer 109 can be the first doping type, and may be located on the upper surface of base layer 101. For example, source region 104 can be located at a first side of the gate structure, and semiconductor layer 109 may be located at a second side of the gate structure, whereby the first and second sides of the gate structure are opposite to each other. In this example, base layer 101 is a "second" doping type. Semiconductor layer 109 can be located on the upper surface of base layer 101, and may serve as the drain region of the metal-oxide-semiconductor device, and also as a partial withstand voltage region of the metal-oxide-semiconductor device. Here, the first doping type is one of N-type or P-type, and the second doping type is the other one of N-type or P-type.

In particular embodiments, the metal-oxide-semiconductor device can also include drift region 103 located in base layer 101, and drift region 103 can be a first doping type. Also, drift region 103 may be in contact with semiconductor layer 109, and can extend from semiconductor layer 109 to below a part of the gate structure. Drift region 103 can be separated from source region 104 by a distance as the channel region of the device. For example, the metal-oxide-semiconductor device can also include body region 102 with a first doping type extending from the upper surface of base layer 101 to an internal portion of the base layer 101. For example, source region 104 can be located in body region 102. The gate structure may cover at least part of body region 102. Also, part of body region 102 below the gate structure can be a channel region of the device. Drift region 103 may be in contact with body region 102. In another example, a doped region of the first doping type may also be provided in the base layer, and the body region, the source region and the drift region may all be located in the doped region, and drift region 103 may not be in contact with the body region 102.

Figure 2:
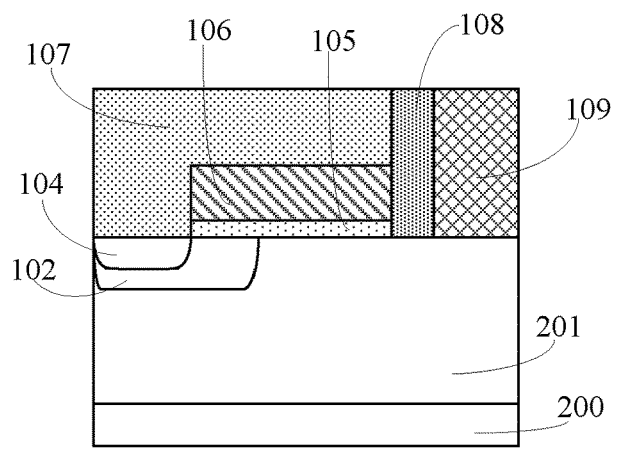
FIG. 2 is a cross-sectional view diagram of a second example metal-oxide-semiconductor device, in accordance with embodiments of the present invention.

Referring now to FIG. 2, shown is a cross-sectional view diagram of a second example metal-oxide-semiconductor device, in accordance with embodiments of the present invention. Here, the base layer can be configured as drift region 201 of the first doping type, and body region 102 and source region 104 may be located in drift region 201. Further, the device can also include substrate 200 located under the base layer (drift region 201). It should be noted that the structure in the base layer is not limited to the above-mentioned structures, and those skilled in the art will recognize that it can be set according to the requirements of the device.

In particular embodiments, the device can also include interlayer dielectric 107 and isolation layer 108. Interlayer dielectric 107 may cover the upper surface of base layer 101 and an upper surface of the gate structure, and isolation layer 108 can be located on the upper surface of the base layer and located between the gate structure and semiconductor layer 109, in order to isolate the gate structure from semiconductor layer 109. In this embodiment, an upper surface of interlayer dielectric 107, an upper surfaces of isolation layer 108, and the upper surface of semiconductor layer 109 can be flush. In addition, the device may also include a field oxide layer located on the upper surface of base layer 101 and in contact with the gate oxide layer. Drift region 103 may extend below the field oxide layer, and the gate conductor that extends above the field oxygen may serve as a field plate, in order to increase the breakdown voltage of the device.

In particular embodiments the metal-oxide-semiconductor device, when subjected to high voltage, a depletion layer may extend from drift region 103 to semiconductor layer 109, such that drift region 103 and semiconductor layer 109 may serve as high resistance regions to withstand the high voltage. Therefore, the thickness of semiconductor layer 109 in the vertical direction of the device can be set according to the particular withstand voltage requirements of the device. The higher the withstand voltage of the device is, the thicker the thickness of semiconductor layer 109 in the vertical direction of the device. In certain embodiments, semiconductor layer 109 can be used as a partial withstand voltage region of the device, and instead of drift region 103 withstanding part of the high voltage, the length of drift region 103 can be reduced, and the size of the device and the on-resistance of the device can accordingly be reduced. In addition, semiconductor layer 109 can be located on the upper surface of the base layer, and may have the same height as the interlayer dielectric. Further, the height of the interlayer dielectric can be changed according to different voltage requirements of the device.

It should be noted that since semiconductor layer 109 can withstand a relatively high voltage, while the voltage on the gate structure is generally low, isolation layer 108 may be utilized to isolate semiconductor layer 109 from the gate structure. The quality and width of isolation layer 108 can be set according to the withstand voltage requirements of the device, in order to prevent from being broken down. In this example, isolation layer 108 may be a high temperature oxide (HTO) layer. Of course, those skilled in the art will recognize that other suitable isolation layers can be employed in certain embodiments. The higher the withstand voltage requirement of the device, the greater the width of isolation layer 108 along the lateral direction of the device. As compared with other LDMOS devices, the metal-oxide-semiconductor device in certain embodiments may reduce the size and on-resistance of the device, while closely matching other properties of the LDMOS. As compared with other trench MOS devices, the fabrication process certain embodiments is relatively simple, while also being compatible with CMOS processes.

In particular embodiments, a method of forming a metal-oxide-semiconductor device can include: providing a base layer; forming a source region extending from an upper surface of the base layer to internal portion of the base layer and having a first doping type; forming a gate structure located on the upper surface of the base layer and at least exposing the source region, and forming a semiconductor layer located on the upper surface of the base layer and having the first doping type, where the semiconductor layer is used as a partial withstand voltage region of the device, and the source region is located at a first side of the gate structure, the semiconductor layer is located at a second side of the gate structure, and the first side and the second side of the gate structure are opposite.

Figure 3A:
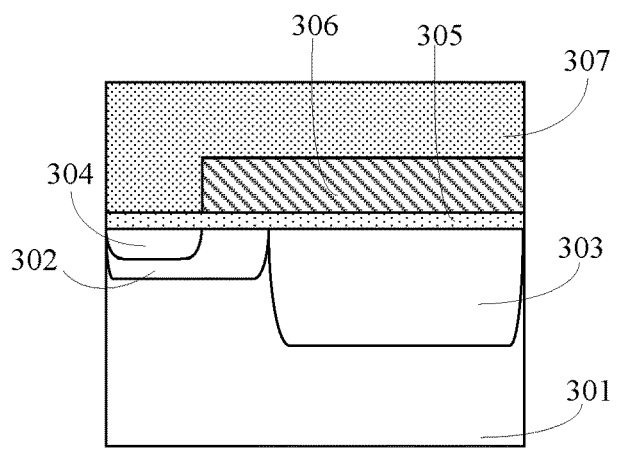
FIGS. 3A-3D are cross-sectional view diagrams of various stages of an example method of manufacturing a metal-oxide-semiconductor device, in accordance with embodiments of the present invention.

Referring now to FIGS. 3A-3D, shown are cross-sectional view diagrams of various stages of an example method of manufacturing a metal-oxide-semiconductor device, in accordance with embodiments of the present invention. As shown in FIG. 3A, base layer 301 may be provided, where base layer 301 can be a second doping type. Also, body region 302 can be formed to extend from the upper surface of base layer 301 to its interior portion, and body region 302 can be the second doping type. Source region 304 may be formed to extend from the upper surface of base layer 301 to its interior portion, where source region 304 can be a first doping type, and source region 304 may be located in body region 302. Drift region 303 may be formed to extend from the upper surface of base layer 301 to its interior portion, and drift region 303 can be the first doping type. For example, drift region 303 may be in contact with body region 302.

In another embodiment, a doped region of the first doping type may be formed in base layer 301, and body region 302, source region 304, and drift region 303 can all be formed in the doped region. For example, drift region 303 may not be in contact with body region 302. In another embodiment, base layer 301 may also be a drift region of the first doping type, and body region 302 of the second doping type, and source region 304 of the first doping type, can be formed in base layer 301 (drift region). Further, a bottom surface of base layer 301 can also include a substrate.

Further, gate oxide layer 305 can be formed on the upper surface of base layer 301, gate conductor 306 may be formed on gate oxide layer 305. Also, interlayer dielectric 307 can be formed to cover gate oxide layer 305 and gate conductor 306. For example, gate conductor 306 can cover at least part of body region 302, and may expose source region 304. In other embodiments, gate oxide layer 305 may also be etched to align with the sidewalls of gate conductor 306 to expose source region 304, and then interlayer dielectric 307 can cover the upper surface of the base layer and an upper surface of gate conductor 306.

Figure 3B:
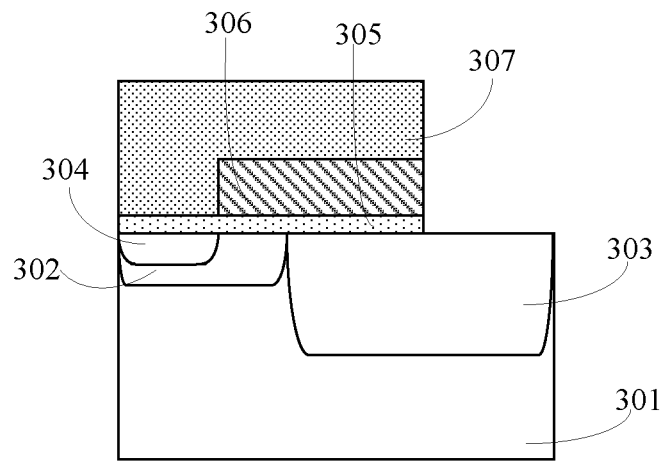

As shown in FIG. 3B, interlayer dielectric 307, gate oxide layer 305, and gate conductor 306 can be etched to form a through hole that exposes the upper surface of the base layer at a second side of the gate structure; that is, part of an upper surface of drift region 303. In this embodiment, the etched gate oxide layer 305 and gate conductor 306 may form the gate structure. In other embodiments, after forming gate oxide layer 305 and gate conductor 306, they may be directly etched to form a gate structure that at least exposes the source region and part of an upper surface of drift region 303. Then, an interlayer dielectric can be formed that covers the upper surface of the base layer and the gate structure, and the interlayer dielectric can be etched to form the through hole. Of course, the formation method and step sequence of the gate structure and the interlayer dielectric are not limited to these particular examples, and others can be supported in certain embodiments.

Figure 3C:
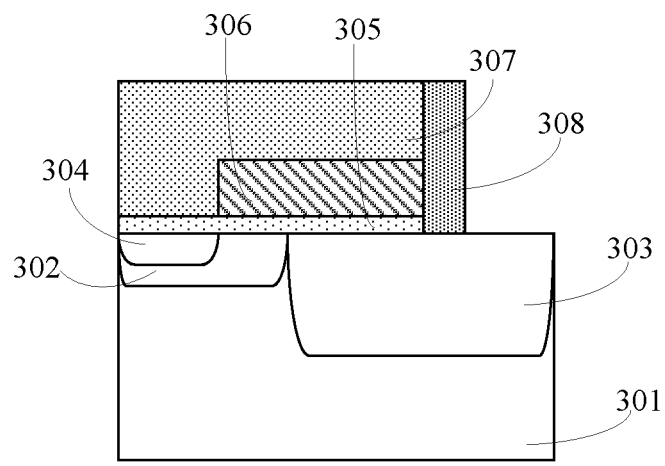

As shown in FIG. 3C, isolation layer 308 may be formed in the through hole, and isolation layer 308 can be in contact with interlayer dielectric 307 and the gate structure. Isolation layer 308 can be used to isolate the gate structure from the semiconductor layer formed by subsequent processes. For example, an insulating layer may be deposited in the through hole, and the insulating layer can be etched by an anisotropic etching process to form isolation layer 308 that covers the sidewalls of the interlayer dielectric and the sidewalls of the gate structure. For example, isolation layer 308 can be an HTO layer formed by a high-temperature process.

Figure 3D:
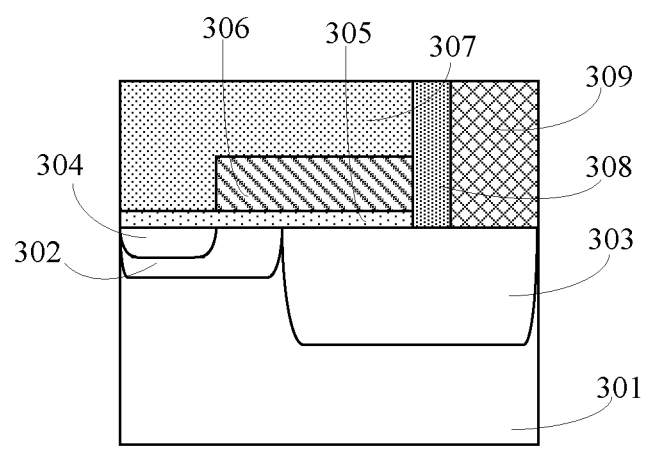

As shown in FIG. 3D, semiconductor layer 309 can be filled in the through hole. For example, semiconductor layer 309 can be polysilicon. The example method of forming semiconductor layer 309 can include depositing polysilicon in the through hole, and using a chemical mechanical polishing (CMP) process to remove excess polysilicon such that the upper surface of the polysilicon is flush with the upper surface of the interlayer dielectric to form semiconductor layer 309. Optionally, the semiconductor layer may be formed by using an epitaxial process to grow silicon in the through hole.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A metal-oxide-semiconductor device, comprising:
    a) a base layer;
    b) a source region extending from a top surface of the base layer to internal portion of the base layer and having a first doping type;
    c) a gate structure located on the top surface of the base layer and at least exposing the source region;
    d) a semiconductor layer located on the top surface of the base layer and having the first doping type, wherein a bottom surface of the semiconductor layer is in direct contact with the top surface of the base layer with no layers therebetween; and
    e) wherein the semiconductor layer is used as a partial withstand voltage region of the device, the source region is located at a first side of the gate structure, the semiconductor layer is located at a second side of the gate structure, and the first and second sides of the gate structure are opposite to each other.

2. The metal-oxide-semiconductor device of claim 1, further comprising a body region extending from the top surface of the base layer to internal portion of the base layer and having a second doping type, wherein the source region is located in the body region, and a part of the body region is covered by the gate structure.

3. The metal-oxide-semiconductor device of claim 2, further comprising a region having the first doping type in the base layer, wherein the region is in contact with the top surface of the base layer, the body region, and the semiconductor layer.

4. The metal-oxide-semiconductor device of claim 1, wherein the semiconductor layer is used as a drain region of the metal-oxide-semiconductor device.

5. The metal-oxide-semiconductor device of claim 2, further comprising a drift region of the first doping type, wherein the drift region is in contact with the semiconductor layer, and the drift region is located in the base layer.

6. The metal-oxide-semiconductor device of claim 1, wherein the semiconductor layer and the gate structure are isolated by an isolation layer.

7. The metal-oxide-semiconductor device of claim 1, wherein the semiconductor layer and the gate structure are separated by an oxide layer that is formed by high-temperature oxidation.

8. The metal-oxide-semiconductor device of claim 1, wherein the higher the withstand voltage requirement of the device, the greater the thickness of the semiconductor layer along the vertical direction of the device.

9. The metal-oxide-semiconductor device of claim 1, wherein the higher the withstand voltage requirement of the device, the greater the width of the isolation layer along the lateral direction of the device.

10. The metal-oxide-semiconductor device of claim 6, further comprising an interlayer dielectric covering the top surface of the base layer and an upper surface of the gate structure, wherein the isolation layer is in contact with the interlayer dielectric and the gate structure.

11. The metal-oxide-semiconductor device of claim 1, wherein the semiconductor layer comprises polysilicon.

12. The metal-oxide-semiconductor device of claim 1, wherein the semiconductor layer comprises epitaxial silicon.

13. A method for manufacturing a metal-oxide-semiconductor device, the method comprising:

a) providing a base layer;
b) forming a source region extending from a top surface of the base layer to internal portion of the base layer and having a first doping type;
c) forming a gate structure located on the top surface of the base layer and at least exposing the source region;
d) forming a semiconductor layer located on the top surface of the base layer and having the first doping type, wherein a bottom surface of the semiconductor layer is in direct contact with the top surface of the base layer with no layers therebetween; and
e) wherein the semiconductor layer is used as a partial withstand voltage region of the device, the source region is located at a first side of the gate structure, the semiconductor layer is located at a second side of the gate structure, and the first and second sides of the gate structure are opposite to each other.

14. The method of claim 13, further comprising forming a body region extending from the top surface of the base layer to internal portion of the base layer and having a second doping type, wherein the source region is located in the body region, and a part of the body region is covered by the gate structure.

15. The method of claim 14, further comprising forming a region having the first doping type in the base layer, wherein the region is in contact with the top surface of the base layer, the body region, and the semiconductor layer.

16. The method of claim 13, further comprising forming an interlayer dielectric covering the top surface of the base layer and an upper surface of the gate structure, wherein the interlayer dielectric comprises a through hole that exposes the top surface of the base layer located at the second side of the gate structure.

17. The method of claim 16, wherein the forming the semiconductor layer comprises:
a) depositing a polysilicon in the through hole; and
b) removing excess polysilicon by a chemical mechanical polishing process such that an upper surface of the polysilicon is flush with the upper surface of the interlayer dielectric.

18. The method of claim 16, wherein the forming the semiconductor layer comprises epitaxially growing silicon in the through hole.

19. The method of claim 16, wherein prior to the forming the semiconductor layer, the method further comprises forming an isolation layer covering sidewalls of the interlayer dielectric and sidewalls of the gate structure in the through hole, wherein the isolation layer isolate the semiconductor layer and the gate structure.

20. The method of claim 19, wherein the isolation layer comprises a high temperature oxide layer.

* * * * *